(12) United States Patent
Wong et al.

(10) Patent No.: US 11,343,906 B2
(45) Date of Patent: May 24, 2022

(54) STACKED SCALABLE VOLTAGE REGULATOR MODULE FOR PLATFORM AREA MINIATURIZATION

(71) Applicant: Intel Corporation, Santa Clara, CA (US)

(72) Inventors: Tai Loong Wong, Bayan Lepas Pulau Pinang (MY); Fern Nee Tan, Bayan Lepas Pulau Pinang (MY); Tin Poay Chuah, Bayan Baru Pulau Pinang (MY); Min Suet Lim, Gelugor Pulau Pinang (MY); Siang Yeong Tan, Bayan Lepas Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/988,759

(22) Filed: Aug. 10, 2020

(65) Prior Publication Data

US 2021/0385942 A1  Dec. 9, 2021

(30) Foreign Application Priority Data

Jun. 8, 2020 (MY) .............................. PI2020002911

(51) Int. Cl.
*H05K 1/02* (2006.01)
*H05K 1/14* (2006.01)

(52) U.S. Cl.
CPC .......... *H05K 1/0262* (2013.01); *H05K 1/144* (2013.01); *H05K 2201/10409* (2013.01); *H05K 2201/10621* (2013.01)

(58) Field of Classification Search
CPC ........ H05K 1/0262; H05K 1/14; H05K 1/144; H05K 1/145; H05K 1/18; H05K 2201/10409; H05K 2201/10621; H05K 2201/10515; H01L 2924/1427
See application file for complete search history.

(56) References Cited

U.S. PATENT DOCUMENTS

| | | | | |
|---|---|---|---|---|
| 6,111,753 A * | 8/2000 | Singer | ..................... | G06F 1/184 361/719 |
| 6,597,062 B1 * | 7/2003 | Li | ......................... | G11C 5/063 257/686 |
| 2014/0185214 A1 * | 7/2014 | Jia | ........................... | G06F 1/188 361/679.4 |
| 2014/0198471 A1 * | 7/2014 | Kajio | ..................... | H05K 1/142 361/804 |
| 2017/0094792 A1 * | 3/2017 | Dunkel | .................. | H05K 1/144 |

* cited by examiner

*Primary Examiner* — Hoag Nguyen
*Assistant Examiner* — Amol H Patel
(74) *Attorney, Agent, or Firm* — Viering, Jentschura & Partner MBB

(57) ABSTRACT

The present disclosure generally relates to a scalable computer circuit board having a first power level semiconductor package coupled to at least one base-level voltage regulator module, which is coupled to a plurality of connection receptacles that are configured for connecting with a voltage regulator module positioned on a second level, as a standardized base unit. To scale the base unit, a second power level semiconductor package may be exchanged for the first power level semiconductor package in conjunction with one or more voltage regulator module board being positioned over a corresponding number of base-level voltage regulator modules and coupled to their plurality of connection receptacles.

15 Claims, 6 Drawing Sheets

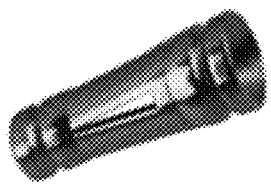 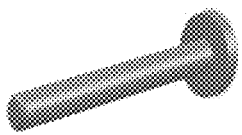
Fig. 11A                    Fig. 11B

STACKED SCALABLE VOLTAGE REGULATOR MODULE FOR PLATFORM AREA MINIATURIZATION

CROSS-REFERENCE TO RELATED APPLICATIONS

This application claims priority to Malaysian Patent Application No. PI2020002911, which was filed on Jun. 8, 2020, the entire contents of which are hereby incorporated herein by reference.

BACKGROUND

In today's computer industry, hardware standardization is one of its greatest strengths in producing increasingly powerful devices at a reasonable price. Standardization provides the ability to mix and match parts as needed. But not all motherboards are the same physical size. There are different form factors for different types of computer devices. Moreover, in an attempt to standardize, the typical solution is to design a larger board to accommodate the most densely packed configuration, i.e., the highest current/power implementation.

Also, with continued miniaturization, the optimized placement of the various modules supporting a central processing unit (CPU) package or a system-on-chip (SOC) package is important for providing efficient and improved performance. For higher-end performance computer devices, there is a need for increasing numbers of voltage regulator modules, along with the challenges in meeting the desired load line and short loop inductance to deliver high current/power to their CPU packages. In other words, as the power consumption of microprocessors increases, a high module or phase count for the voltage regulator section is required to meet the power requirement (>180 A) and high efficiency requirements.

A voltage regulator (VR) is used to regulate voltage levels to provide a steady, fixed output voltage that remains constant for any changes in an input voltage or load conditions. The VR acts as a direct current (DC)-to-DC power converter which steps down voltage (while stepping up current) from its input (supply) to its output (load). It also acts as a buffer for protecting components from damage. There numerous types of regulators (e.g., linear, switching, etc.), and switching VRs are widely used for semiconductor applications. VRs are typically "buck converters", which are used due to their efficiency. The VRs may have relatively complex designs that require significant space for their various subcomponents.

In considering design layouts, when the voltage regulator modules are positioned, it is undesirable to have them further from the CPU or SOC package, as it may result in a higher loop inductance, which requires more decoupling capacitors, a higher loop resistance, which may cause power delivery to be less efficient, and a higher current draw from the nearest voltage regulator modules, which may damage the voltage regulator modules due to overclocking. However, configuring the placement of voltage regulator modules on a motherboard may provide opportunities for scalability and standardization.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 11A and 11B show a connection receptacle component and plug component, respectively, of an exemplary connection fastener according to an aspect of the present disclosure.

DETAILED DESCRIPTION

Figure 1:
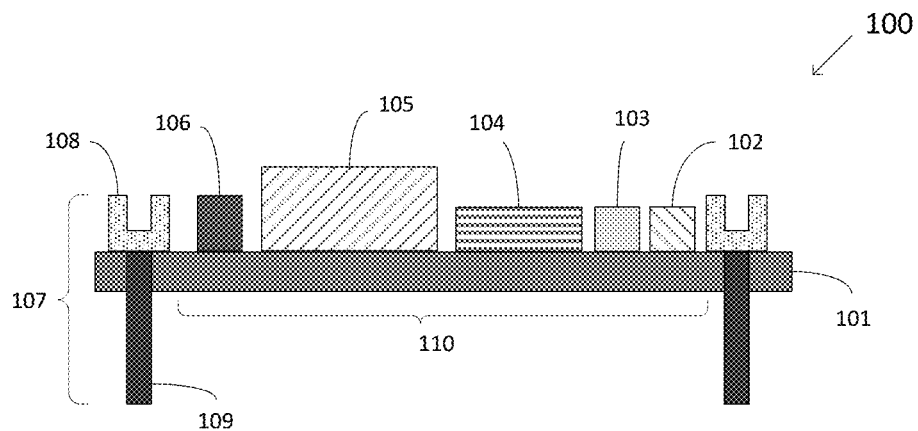
FIG. 1 shows a cross-section view of a voltage regulator module board (VRMB) with an on-board voltage regulator module according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a scalable computer circuit board having a "base" or first power level semiconductor package, i.e., needing a set power requirement, that may be coupled to a required number of voltage regulator modules or phases coupled to the circuit board (hereinafter "base level voltage regulator modules"). For example, the first power level semiconductor package may have a set power requirement of 15 W, with an accompanying three voltage regulators modules. Each base level voltage regulator module may be coupled to a plurality of connection receptacles that are configured and purposed for connecting with an on-board voltage regulator module positioned on a second level. This configuration may be deemed a standardizable "base unit circuit board" according to the present disclosure. It should be understood that the base unit circuit board may include other devices and components coupled thereon; for example, memory devices, storage devices, graphical processors, embedded controller, I/O ports and other devices.

According to an aspect for scaling the base unit circuit board, a second power level semiconductor package, with a higher power requirement, may be exchanged for the first power level semiconductor package in conjunction with adding one or more voltage regulator module board (VRMB) positioned over a base level voltage regulator module and being coupled to the plurality of connection receptacles. Each VRMB includes a small printed circuit board or sub-board (hereinafter "VR board") with a voltage regulator module coupled thereon (hereinafter "on-board voltage regulator module"), that may be coupled to a plurality of connection fasteners that are configured and purposed for connecting with an on-board voltage regulator module positioned on a third level. It should be understood that the second power level semiconductor package may require more than one VRMB to be used and, correspondingly, being positioned and coupled with more than one base level voltage regulator module.

According to a further aspect for scaling the base unit circuit, a third power level semiconductor package, with an even higher power requirement, may be exchanged for the first power level semiconductor package in conjunction with one or more stacked VRMB being positioned at the third level over the on-board voltage regulator module at the second level and coupled to the plurality of connection fasteners. It should be also understood that the third power level semiconductor package may require more than one VRMB to be used and, correspondingly, positioned, and coupled with a pre-positioned on-board level voltage regulator module.

According to an aspect, all voltage outputs from base-level and on-board voltage modules modules are independently connectly to the SOC package to provide power to it (i.e., parallel connections).

In the various aspects, it should be understood that the first, second, and/or third power level semiconductor packages may house a SOC or CPU. It should be further understood that the terms SOC and CPU may be used interchangeably according to the present disclosure.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

According to the present disclosure, FIG. 1 shows a cross-section view of a VRMB 100 that may be a standard component used with a base unit circuit board. In this aspect, the VRMB 100 may include a VR board 101 with an on-board voltage regulator module or phase 110. The on-board voltage regulator module 110 includes an input capacitor 102, a DrMOSFET 104, an inductor 105, and an output capacitor 106, which are the standard sub-components for the on-board voltage regulator modules and the base level voltage regulator modules. In FIG. 1, the on-board voltage regulator module 110 may also have a phase doubler 103, which may be provided with the standard sub-components for the on-board voltage regulator modules and the base level voltage regulator modules. It should be understood that modules and phases are used interchangeably according to the present disclosure.

According to the present disclosure, the VR board 101, which supports and couples these aforementioned sub-components, may have traces and a variety of vias (i.e., through vias, blind vias, embedded vias). While the VR board 101 may have a rectangular shape, as shown the figures, it should be understood that other suitable shapes may be used to facilitate their attachment to the base unit circuit board and/or may be standardized for convenient manufacturing.

In an aspect, the DrMOSFET 103 may be used for synchronous rectification, the input capacitor 102 act as supply-side filters, and in combination with inductor 105, may be used as an energy storage element, and the out capacitor 106 acts as a load-side filter (sometimes in combination with inductors) to reduce voltage ripples. A DrMOSFET is an acronym for Driver and MOSFET module, which is a high-efficiency synchronous buck power module consisting of two asymmetrical MOSFETs and an integrated driver.

In a further aspect of FIG. 1, the VRMB 100 may include a plurality of connection fasteners 107, which provide the coupling connection for the on-board voltage regulator modules with the base level voltage regulator modules. Each of the plurality of connection fasteners 107 may have a connection receptacle component 108 and a plug component 109, which are described further below with regard to an exemplary connection fastener shown in FIGS. 11A and 11B.

Figure 2:
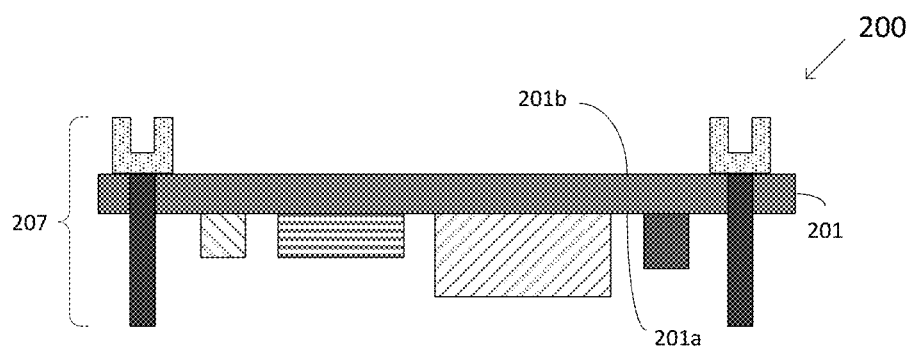
FIG. 2 shows a cross-section view of another VRMB having an inverted on-board voltage regulator module according to another aspect of the present disclosure.

In an aspect shown in FIG. 2, a cross-section view of another VRMB 200 may be configured with an "inverted" on-board voltage regulator module that may be another standard component used with a base unit circuit board according to another aspect of the present disclosure. A VR board 201 may have a top surface 201a and bottom surface 201b, with an on-board voltage regulator module coupled to top surface 201a. The VRMB 200 does include a phase doubler. According to all aspects of the present disclosure, a phase doubler may always be considered an optional sub-component depending on the design requirement. In an aspect of the assembly of VRMB 200, a plurality of connection fasteners 207 may be inserted from the bottom surface 201b to provide the invert on-board voltage regulator module.

Figure 3:
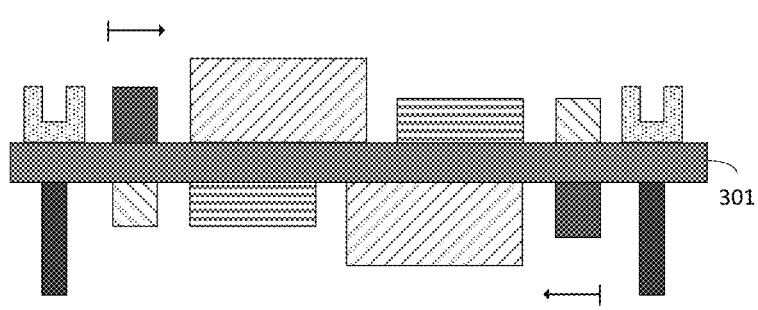
FIG. 3 shows a cross-section view of a double-sided VRMB with two on-board voltage regulator modules, with one on-board voltage regulator module on a top surface and the other an inverted on-board voltage regulator module on a bottom surface according to yet another aspect of the present disclosure.
Figure 7:
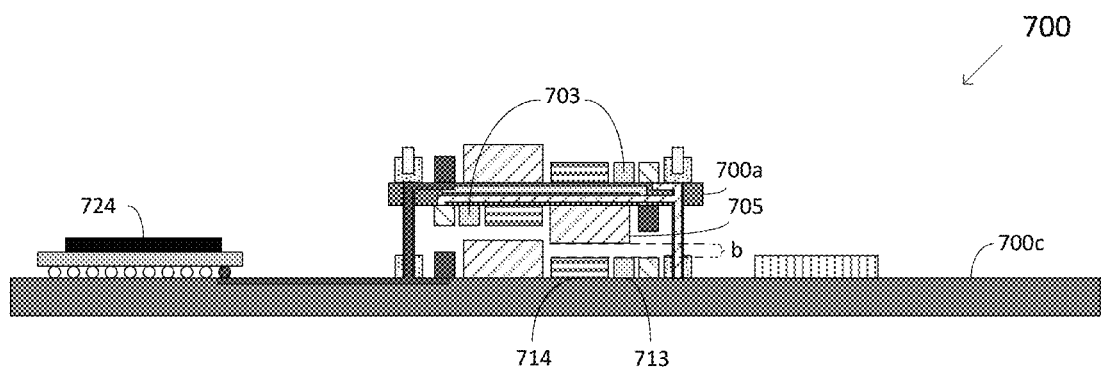
FIG. 7 shows a cross-section view of a scalable computer circuit board coupled to double-sided VRMB according to an aspect of the present disclosure.
Figure 8:
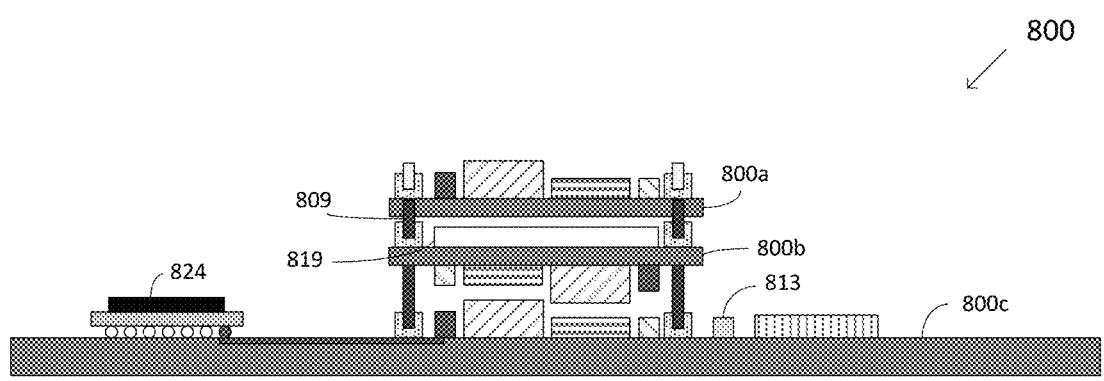
FIG. 8 shows a cross-section view of a scalable computer circuit board coupled to two stacked VRMBs, with one being an inverted VRMB with a heat spreader according to an aspect of the present disclosure.

FIG. 3 shows a cross-section view of a double-sided VRMB 300 with two on-board voltage regulator modules, with one being an on-board voltage regulator module on a top surface and the other being an inverted on-board voltage regulator module on a bottom surface, that may be a further standard component used with the base unit circuit broad according to yet another aspect of the present disclosure. In an aspect, as shown in FIG. 3, the order of the sub-components of the on-board voltage regulator module on a top surface of VR board 301, as viewed from left to right, is maintained for an inverted on-board voltage regulator module on a bottom surface VR board, as viewed from right to left. This order is determined by the heights of the various sub-components and arranged to provide the inverted on-board voltage regulator module a complementary "fit" with an underlying base level voltage regulator module or on-board voltage regulator module, as shown in FIGS. 7 and 8.

Figure 4A:
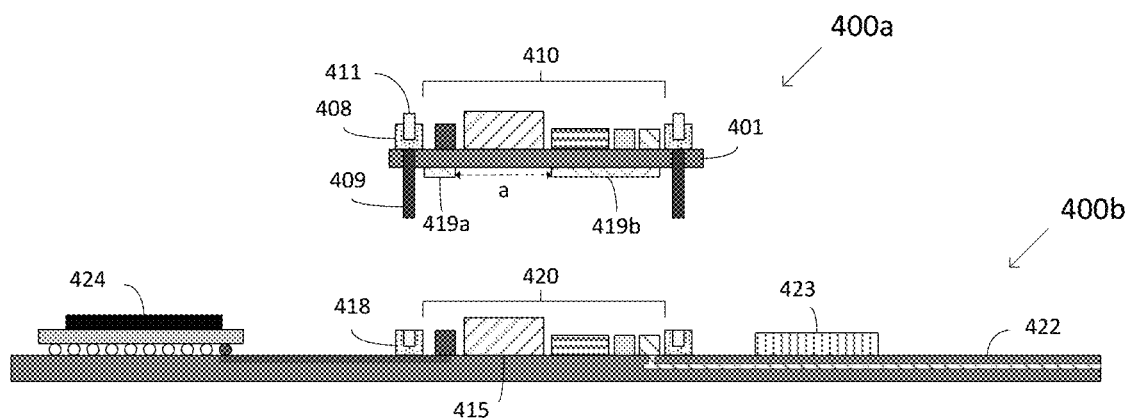
FIG. 4A shows a cross-section view of a scalable computer circuit board with a VRMB being positioned for coupling according to an aspect of the present disclosure.

In FIG. 4A, according to an aspect of the present disclosure, a cross-section view of a base unit circuit board 400b with a VRMB 400a is shown being positioned for coupling. A VR board 401 with on-board voltage regulator module 410 is positioned over a base level voltage regulator module 420 on a printed circuit board (PCB) 422 of the base unit circuit board 400b, with plug portions 409 being aligned to be received by connection receptacles 418 on the PCB 422. It should be understood that VRMB 400 and base level voltage regulator module 420 may illustrative of one or more VRMBs and base level voltage regulator modules being positioned for coupling.

In addition, the VR board 401 may have optional heat spreaders 419a and 419b attached to its bottom surface, with a gap "a" between them to accommodate an inductor 415, which part of the base level voltage regulator module 420. The gap "a" between the heat spreaders 419a and 419b may be formed from an opening in a single layer of thermally conductive material or by them being two separate layers. A cap 411 may be placed in connection receptacle component 408 to prevent particulate contamination.

In addition, as shown in FIG. 4A, the base unit circuit board 400b includes a second power level semiconductor package 424, which is a substitute for a first power level semiconductor package (not shown), having a higher power requirement, e.g., 28 W or 45 W, and an Intel mobile voltage positioning or IMVP controller 423, which dynamically adjusts the processor voltage (Vcc) based on the processor activity to reduce processor power.

Figure 4B:
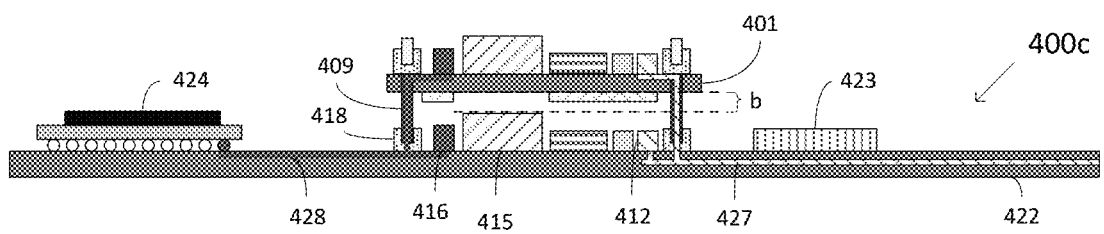
FIG. 4B shows a cross-section view of the scalable computer circuit board and the VRMB of FIG. 4A coupled according to an aspect of the present disclosure.

As shown in FIG. 4B, as denoted with reference no. 400c, the base unit circuit board 400b, and the VRMB 400a of FIG. 4A are coupled together according to the present disclosure. The plug portions 409 may be inserted into the connection receptacles 418 on the PCB 422 and they are electrically coupled as well. A gap "b" may be maintained between a top surface of the inductor 415 and a bottom surface of the VR board 401, which may be a separation in the range of approximately 0.15 to 0.5 mm.

In addition, as shown in FIG. 4B, an illustrative trace 427 may be connected to input capacitors 412 to provide power from a power supply unit and/or battery (both not shown) and an illustrative trace 428 may connect the output capacitors 416 to the second power level semiconductor package 424 to provide power thereto according to an aspect of the present disclosure.

In aspects where overall height may be important, it may be estimated (assuming an inductor may have a height (i.e., in the z-direction) of approximately 1.5 mm×2, a PCB may have a thickness of approximately 0.3 mm×2, and maintaining a gap between a VR board and a top surface of an inductor below the VR board of approximately 0.15 mm), that the overall height of a scalable computer circuit board with a second level of on-board voltage regulator modules may be approximately 3.75 mm. According to the present disclosure, there may be instances when there are no practical height requirement or limitation because many computer systems have sufficient space in the Z-direction, for example, in desktop computers or servers.

Figure 5:
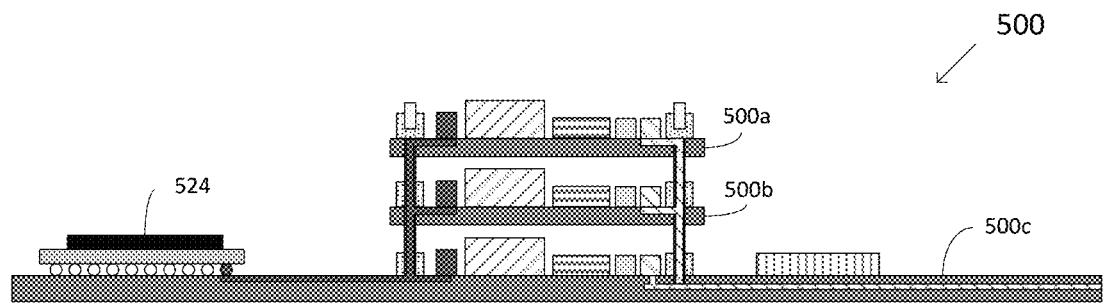
FIG. 5 shows a cross-section view of a scalable computer circuit board coupled to two stacked VRMBs according to an aspect of the present disclosure.

In an aspect, FIG. 5 shows a cross-section view of a scalable computer circuit board 500 having two stacked VRMBs 500a and 500b coupled to a base unit circuit board 500c according to the present disclosure. A third power level semiconductor package 524, having a greater power requirement, e.g., over 45 W, may be used with the scalable computer circuit board 500.

Figure 6:
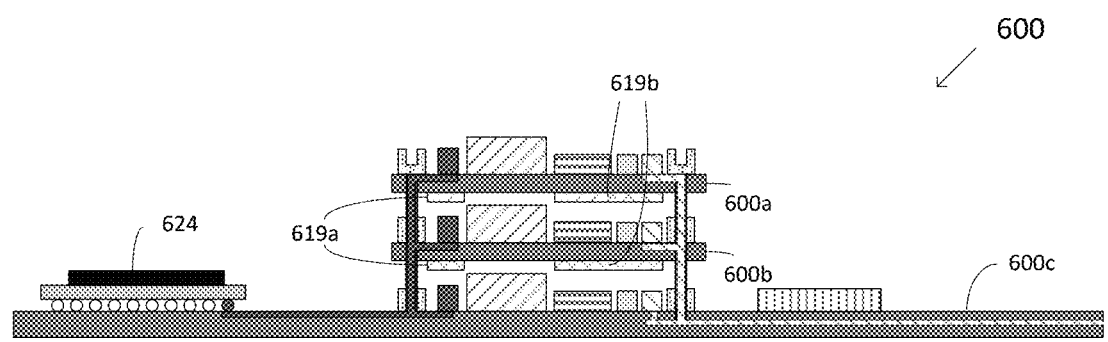
FIG. 6 shows a cross-section view of a scalable computer circuit board coupled to two stacked VRMBs having heat spreaders according to an aspect of the present disclosure.

In FIG. 6, an aspect similar to FIG. 5, a cross-section view of a scalable computer circuit board 600 having two stacked VRMBs 600a and 600b, which each have optional heat spreaders 619a and 619b, are shown coupled to a base unit circuit board 600c. A third power level semiconductor package 624 having a greater power requirement, e.g., over 45 W, may be used with the scalable computer circuit board 600.

According to the aspect shown in FIG. 7, a cross-section view of a scalable computer circuit board 700 shows a double-sided VRMB 700a coupled to a base unit circuit board 700c according to the present disclosure. The double-sided VRMB 700a, which is similar to the VRMB 300, may have two on-board voltage regulator modules, with one being an on-board voltage regulator module on a top surface and the other being an inverted on-board voltage regulator module on a bottom surface. In this aspect, the double-sided VRMB 700A has phase doublers 703 that are not present in the double-sided VRMB 300.

In an aspect, as shown in FIG. 7, the order of the sub-components of the inverted on-board voltage regulator module of VRMB 301 is arranged to provide a complementary fit with an underlying base level voltage regulator module. A gap "b" may be maintained between a top surface of the DrMOSFET 714 and a bottom surface of inductor 705, which may be a separation in the range of approximately 0.15 to 0.5 mm.

In a further aspect shown in FIG. 7, a third power level semiconductor package 724 having a greater power requirement, e.g., over 45 W, may be used with the scalable computer circuit board 700.

FIG. 8 shows a cross-section view of a scalable computer circuit board 800 coupled to two stacked VRMBs 800a and 800b, with VRMB 800B being an inverted VRMB with heat spreader according to an aspect of the present disclosure. In this aspect, the VRMB 800a may have a shorter plug component 809 so that the distance with VRMB 800b may be minimized. The VRMB 800b is similar to VRMB 300, with the difference being a heat spreader 819 attached to the surface opposite from the inverted on-board voltage regulator module.

In another aspect, a phase doubler may be positioned remotely from the voltage regulator modules and coupled to the PCB for the base unit circuit board 800c. In an aspect of the present disclosure, a remote phase doubler may allow the base-level and on-board voltage modules to be standardized with fewer sub-components; especially, given that the phase doubler may be an optional sub-component.

In a further aspect shown in FIG. 8, a third power level semiconductor package 824 having a greater power requirement, e.g., over 45 W, may be used with the scalable computer circuit board 800.

Figure 9A:
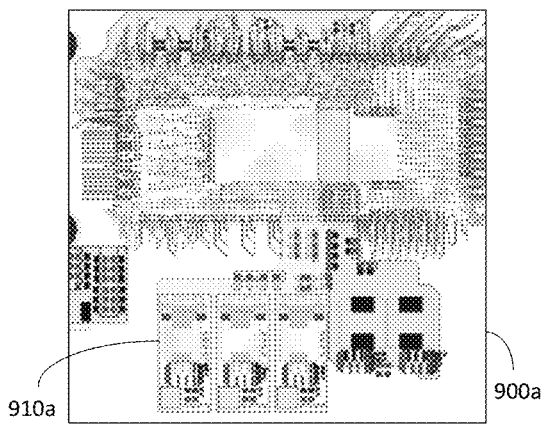
FIGS. 9A, 9B and 9C show representative CAD layouts of scalable computer circuit boards with three base-level voltage regulator modules, an additional second level stacked over three base-level voltage regulator modules, and an additional third level of three VRMBs stacked over a second level of three VRMBs, which in turn is stacked over three base-level voltage regulator modules, respectively, according to an aspect of the present disclosure.

FIG. 9A shows a representative CAD layout of a scalable computer circuit board 900a with three base-level voltage regulator modules 910a according to an aspect of the present disclosure. The scalable computer circuit board 900a may be, for example, a first power level semiconductor package with a 15 W platform (3 phase VccIA), base unit circuit board.

Figure 9B:
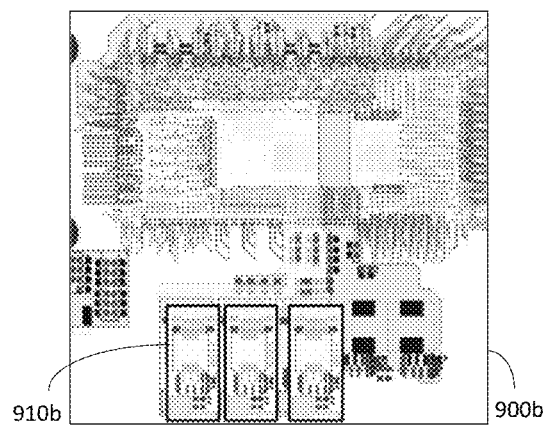

FIG. 9B shows a representative CAD layout of a scalable computer circuit board 900b with three VRMBs 910b on a second level stacked over three base-level voltage regulator modules 910a according to an aspect of the present disclosure. The scalable computer circuit board 900b may be, for example, a scaled circuit board with a second power level semiconductor package having a 45 W platform (6 phase VccIA).

Figure 9C:
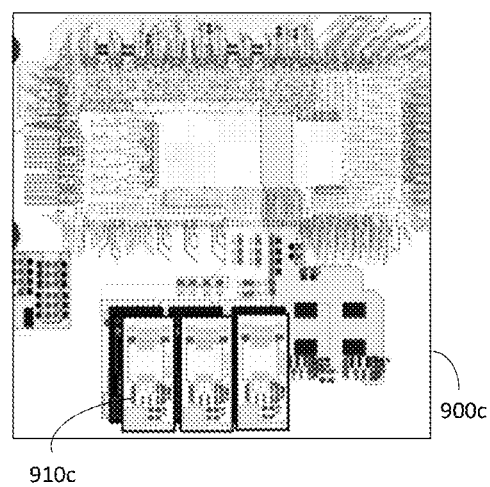

FIG. 9C shows a representative CAD layout of a scalable computer circuit board 900c with a third level of three VRMBs 900c stacked over a second level of three VRMBs, which in turn is stacked over three base-level voltage regulator modules according to an aspect of the present disclosure. The scalable computer circuit board 900c may be, for example, a further scaled circuit board with a third power level semiconductor package having a >45 W platform (9 phase VccIA).

Figure 10A:
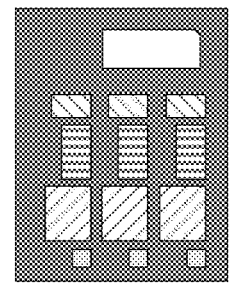
FIGS. 10A, 10B, and 10C show a simplified illustrative top view for FIGS. 9A, 9B, and 9C, respectively; specifically, their voltage regulator module sections, according to aspects of the present disclosure.
Figure 10B:
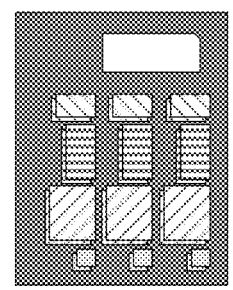
Figure 10C:
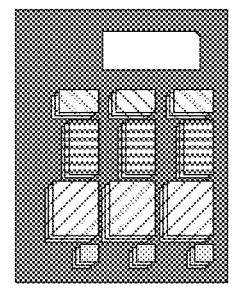

FIGS. 10A, 10B, and 10C show a simplified illustrative top view of FIGS. 9A, 9B, and 9C, respectively, of their voltage regulator module section according to aspects of the present disclosure. The sub-components of base-level voltage regulator modules are shown being stacked over by successive layers of the sub-components of on-board voltage regulator modules on a second and third level.

In FIGS. 11A and 11B, a connection receptacle component and plug component, respectively, are shown for an exemplary connection fastener according to an aspect of the present disclosure. In the various aspects, the connection fastener may be able to handle power current up to 200 A from >45 W power source as a thermal design power delivery requirement. The connection receptacle component may be press fit into a PCB and configured to receive a standard pin type plug component. In the present disclosure, a variety of connection fasteners may be used including TP-type, PCB jumper header, PCB press fit connectors, board-to-board connectors, and other connectors.

Aspects of the present disclosure may be implemented to provide scalable computer circuit boards/motherboards with stacked voltage regulator modules for high-performance computing devices and systems, for example, workstations and servers, with any suitable accompanying hardware and/or software.

In various implementations, the computing devices may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device may be a mobile computing device. In further implementations, the computing device may be any other electronic device that processes data.

To more readily understand and put into practical effect the integrated voltage regulator assembly, particular aspects will now be described by way of examples and not limitations, and with reference to the figures. For the sake of brevity, duplicate descriptions of features and properties may be omitted.

EXAMPLES

Example 1 may include a device having a printed circuit board, a first power level semiconductor package coupled to the printed circuit board, at least one base-level voltage regulator module coupled to the first power level semiconductor package, and a first plurality of connection receptacles coupled to the base level voltage regulator module, in which the connection receptacles are configured for connecting with a second level of voltage regulator module.

Example 2 may include the device of example 1 and/or any other example disclosed herein, further includes a voltage regulator module board at the second level having a plurality of connection fasteners coupled to the first plurality of connection receptacles, in which the voltage regulator module board is positioned over the base level voltage regulator module.

Example 3 may include the device of example 1 and/or any other example disclosed herein, further includes a second base level voltage regulator module having a second plurality of connection receptacles, and a third base level voltage regulator module having a third plurality of connection receptacles, in which the second and third voltage regulator modules are coupled to the semiconductor package.

Example 4 may include the device of example 3 and/or any other example disclosed herein, further includes at least one voltage regulator module board having a plurality of connection fasteners coupled to one of the first, second or third plurality of connection receptacles, in which the voltage regulator module board is positioned over the base level voltage regulator module corresponding to the first, second, or third plurality of connection receptacles.

Example 5 may include the device of example 4 and/or any other example disclosed herein, further includes a second power level semiconductor package being exchanged for the first power level semiconductor package in conjunction with the voltage regulator module board being coupled to one of the plurality of connection receptacles.

Example 6 may include the device of example 3 and/or any other example disclosed herein, in which the at least one voltage regulator module board having a plurality of connection fasteners is a first voltage regulator module board having a first plurality of connection fasteners, further includes the first voltage regulator module board having the first plurality of connection fasteners coupled to the first plurality of connection receptacles, a second voltage regulator module board having a second plurality of connection fasteners coupled to the second plurality of connection receptacles, and a third voltage regulator module board having a third plurality of connection fasteners coupled to the third plurality of connection receptacles, in which the first, second and third voltage regulator module boards are respectively positioned over the base level voltage regulator module corresponding to the first, second and third plurality of connection receptacles.

Example 7 may include the device of example 6 and/or any other example disclosed herein, in which the first, second and third plurality of connection fasteners are configured for connecting with a third level of voltage regulator module, further includes at least one stacked voltage regulator module board having a fourth plurality of connection fasteners coupled to one of the first, second or third plurality of connection fasteners in which the stacked voltage regulator module board is positioned over the voltage regulator module board corresponding to the first, second, or third plurality of connection fasteners.

Example 8 may include the device of example 7 and/or any other example disclosed herein, further includes a third power level semiconductor package being exchanged for the first power level semiconductor package in conjunction with the stacked voltage regulator module board being coupled to one of the plurality of connection fasteners.

Example 9 may include the device of example 2 and/or any other example disclosed herein, in which the base level voltage regulator module further includes at least one input capacitor at least one MOSFET device at least one inductor, and at least one output capacitor.

Example 10 may include the device of example 9 and/or any other example disclosed herein, in which the voltage regulator module board further includes a voltage regulator board having a first surface at least one on-board input capacitor coupled to the first surface at least one on-board MOSFET device coupled to the first surface at least one on-board inductor coupled to the first surface at least one on-board output capacitor coupled to the first surface, and the plurality of connection fasteners coupled to the first surface.

Example 11 may include the device of example 9 and/or any other example disclosed herein, in which the positioning of the voltage regulator module board over the base level voltage regulator module further includes the first surface of the voltage regulator board facing the base level voltage regulator module and the on-board input capacitor, the on-board MOSFET device, the on-board inductor, and the on-board output capacitor being arranged on the first surface to complement the positions of the input capacitor, the MOSFET device, the inductor, and the output capacitor of the base level voltage regulator module to minimize the distance between the voltage regulator module board and the base level voltage regulator module.

Example 12 may include the device of example 9 and/or any other example disclosed herein, in which the base level voltage regulator module further includes a phase doubler.

Example 13 may include the device of example 1 and/or any other example disclosed herein, further includes a remote phase doubler coupled to the printed circuit board.

Example 14 may include a device having a voltage regulator board having a first and second surface, at least one on-board input capacitor coupled to the first surface, at least one on-board MOSFET device coupled to the first surface, at least one on-board inductor coupled to the first surface, at least one on-board output capacitor coupled to the first surface, and a plurality of connection fasteners.

Example 15 may include the device of example 14 and/or any other example disclosed herein, further includes a second on-board input capacitor coupled to the second surface, a second on-board MOSFET device coupled to the second surface, a second on-board inductor coupled to the second surface, and a second on-board output capacitor coupled to the second surface.

Example 16 may include the device of example 15 and/or any other example disclosed herein, further includes at least one on-board phase doubler.

Example 17 may include the device of example 15 and/or any other example disclosed herein, in which the plurality of connection fasteners further includes input voltage connection fasteners and output voltage connection fasteners.

Example 18 may include the device of example 15 and/or any other example disclosed herein, in which the plurality of connection fasteners further includes a plug component and a connection receptacle component, in which the plug component mateably couples with another connection receptacle.

Example 19 may include a computer device having a scalable computer circuit board, the scalable computer circuit board further comprises a printed circuit board, a first power level semiconductor package coupled to the printed circuit board, at least one base-level voltage regulator module coupled to the semiconductor package, and a plurality of connection receptacles coupled to the first voltage regulator module, wherein the connection receptacles are configured for connecting with a second level of voltage regulator module.

Example 20 may include the computer device of example 19 and/or any other example disclosed herein, further includes a voltage regulator module board at the second level having a plurality of connection fasteners coupled to the plurality of connection receptacles and positioned over the base level voltage regulator module, and a second power level semiconductor package being exchanged for the first power level semiconductor package in conjunction with the voltage regulator module board being coupled to the plurality of connection receptacles.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a printed circuit board;
   a first power level semiconductor package coupled to the printed circuit board;
   at least one base-level voltage regulator module coupled to the first power level semiconductor package; and
   a first plurality of connection receptacles coupled to the base level voltage regulator module, wherein the connection receptacles are configured for connecting with a second level of voltage regulator module.

2. The device of claim 1, further comprising:
   a voltage regulator module board at the second level having a plurality of connection fasteners coupled to the first plurality of connection receptacles,
   wherein the voltage regulator module board is positioned over the base level voltage regulator module.

3. The device of claim 2, wherein the base level voltage regulator module further comprises:
- at least one input capacitor;
- at least one MOSFET device;
- at least one inductor; and
- at least one output capacitor.

4. The device of claim 3, wherein the voltage regulator module board further comprises:
- a voltage regulator board having a first surface;
- at least one on-board input capacitor coupled to the first surface;
- at least one on-board MOSFET device coupled to the first surface;
- at least one on-board inductor coupled to the first surface;
- at least one on-board output capacitor coupled to the first surface; and
- the plurality of connection fasteners coupled to the first surface.

5. The device of claim 3, wherein the positioning of the voltage regulator module board over the base level voltage regulator module further comprises:
- the first surface of the voltage regulator board facing the base level voltage regulator module and
- the on-board input capacitor, the on-board MOSFET device, the on-board inductor, and the on-board output capacitor being arranged on the first surface to complement the positions of the input capacitor, the MOSFET device, the inductor, and the output capacitor of the base level voltage regulator module to minimize the distance between the voltage regulator module board and the base level voltage regulator module.

6. The device of claim 3, wherein the base level voltage regulator module further comprises a phase doubler.

7. The device of claim 1, further comprising:
- a second base level voltage regulator module having a second plurality of connection receptacles; and
- a third base level voltage regulator module having a third plurality of connection receptacles, wherein the second and third voltage regulator modules are coupled to the semiconductor package.

8. The device of claim 7, further comprising:
- at least one voltage regulator module board having a plurality of connection fasteners coupled to one of the first, second or third plurality of connection receptacles, wherein the voltage regulator module board is positioned over the base level voltage regulator module corresponding to the first, second, or third plurality of connection receptacles.

9. The device of claim 8, further comprising a second power level semiconductor package being exchanged for the first power level semiconductor package in conjunction with the voltage regulator module board being coupled to one of the plurality of connection receptacles.

10. The device of claim 7, wherein the at least one voltage regulator module board having a plurality of connection fasteners is a first voltage regulator module board having a first plurality of connection fasteners, further comprising:
- the first voltage regulator module board having the first plurality of connection fasteners coupled to the first plurality of connection receptacles;
- a second voltage regulator module board having a second plurality of connection fasteners coupled to the second plurality of connection receptacles; and
- a third voltage regulator module board having a third plurality of connection fasteners coupled to the third plurality of connection receptacles, wherein the first, second and third voltage regulator module boards are respectively positioned over the base level voltage regulator module corresponding to the first, second and third plurality of connection receptacles.

11. The device of claim 10, wherein the first, second and third plurality of connection fasteners are configured for connecting with a third level of voltage regulator module, further comprising
- at least one stacked voltage regulator module board having a fourth plurality of connection fasteners coupled to one of the first, second or third plurality of connection fasteners,
- wherein the stacked voltage regulator module board is positioned over the voltage regulator module board corresponding to the first, second, or third plurality of connection fasteners.

12. The device of claim 11, further comprising a third power level semiconductor package being exchanged for the first power level semiconductor package in conjunction with the stacked voltage regulator module board being coupled to one of the plurality of connection fasteners.

13. The device of claim 1, further comprises a remote phase doubler coupled to the printed circuit board.

14. A computer device comprising:
- a scalable computer circuit board, the scalable computer circuit board further comprises:
  - a printed circuit board;
  - a first power level semiconductor package coupled to the printed circuit board;
  - at least one base-level voltage regulator module coupled to the semiconductor package; and
  - a plurality of connection receptacles coupled to the first voltage regulator module, wherein the connection receptacles are configured for connecting with a second level of voltage regulator module.

15. The computer device of claim 14, further comprising:
- a voltage regulator module board at the second level having a plurality of connection fasteners coupled to the plurality of connection receptacles and positioned over the base level voltage regulator module; and
- a second power level semiconductor package being exchanged for the first power level semiconductor package in conjunction with the voltage regulator module board being coupled to the plurality of connection receptacles.

* * * * *